(12) United States Patent
Menon

(10) Patent No.: US 8,669,461 B2
(45) Date of Patent: *Mar. 11, 2014

(54) ULTRA-HIGH EFFICIENCY MULTI-JUNCTION SOLAR CELLS USING POLYCHROMATIC DIFFRACTIVE CONCENTRATORS

(75) Inventor: Rajesh Menon, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 575 days.

This patent is subject to a terminal disclaimer.

(21) Appl. No.: 12/253,626

(22) Filed: Oct. 17, 2008

(65) Prior Publication Data

US 2010/0095999 A1    Apr. 22, 2010

(51) Int. Cl.
*H01L 31/0232*    (2006.01)

(52) U.S. Cl.
USPC ............. 136/246; 136/251; 136/259; 438/57; 438/70

(58) Field of Classification Search
USPC ................... 136/246, 251, 256; 438/57, 70
See application file for complete search history.

(56) References Cited

U.S. PATENT DOCUMENTS

| | | | | |
|---|---|---|---|---|
| 4,204,881 A | * | 5/1980 | McGrew | 136/246 |
| 5,161,059 A | * | 11/1992 | Swanson et al. | 359/565 |
| 5,268,037 A | * | 12/1993 | Glatfelter | 136/249 |
| 6,015,950 A | * | 1/2000 | Converse | 136/246 |
| 6,469,241 B1 | * | 10/2002 | Penn | 136/246 |
| 6,730,840 B2 | * | 5/2004 | Sasaoka et al. | 136/246 |
| 6,958,868 B1 | * | 10/2005 | Pender | 359/742 |
| 7,081,584 B2 | * | 7/2006 | Mook | 136/246 |
| 2003/0213514 A1 | | 11/2003 | Ortabasi | |
| 2005/0121071 A1 | | 6/2005 | Repetto et al. | |
| 2007/0240760 A1 | | 10/2007 | Gronet | |
| 2007/0277869 A1 | * | 12/2007 | Shan et al. | 136/246 |
| 2008/0048102 A1 | * | 2/2008 | Kurtz et al. | 250/226 |
| 2008/0223439 A1 | * | 9/2008 | Deng et al. | 136/258 |
| 2010/0018565 A1 | * | 1/2010 | Funakoshi | 136/244 |

FOREIGN PATENT DOCUMENTS

WO    9611501    4/1996

OTHER PUBLICATIONS

Ludman et al., The Optimization of a Holographic System for Solar Power Generation, Solar Energy vol. 60, No. 1, pp. 1-9, 1997.*
Ludman et al., Holographic Solar Concentrator for Terrestrial Photovoltaics, IEEE West Coast Photovoltaic Energy Conference, Hawaii, pp. 1208-1211, 1994.*
Srinivasan, Design and Fabricaation of Space Varian Micro Optical Elements, The College of Optics and Photonics, Universit of Central Florida, 2000.*
Notification of Transmittal of the International Search Report and the Written Opinion of the International Searching Authority mailed May 26, 2010 in connection with PCT/US2009/061146.

(Continued)

*Primary Examiner* — Jayne Mershon
(74) *Attorney, Agent, or Firm* — Gesmer Updegrove LLP

(57) ABSTRACT

A photovoltaic cell is provided. The photovoltaic cell includes a concentrator optic structure separating the solar spectrum of light into a plurality of spectral bands. The concentrator optic structure focuses these spectral bands into a plurality of concentric tightly focused ring-shaped spots and a central round spot. A multitude of circular sub-cells are each approximately positioned at a ring-shaped spot associated with a respective spectral band produced by the concentrator optic structure. Each of the sub-cells stores the energy produced at the respective spectral band

15 Claims, 7 Drawing Sheets

(56) References Cited

OTHER PUBLICATIONS

First Office Action issued by the State Intellectual Property Office of the People's Republic of China and English translation thereof, issued on Oct. 10, 2012 in connection with Chinese Application No. 200980141430.2, 3 pages.

Partial English Translation of Japanese Notice of Rejection issued on Oct. 16, 2012 in connection with Japanese Patent Appln. No. 2011-532309, 4 pages.

International Preliminary Report on Patentability issued on Apr. 28, 2011 in connection with International Application PCT/US2009/061146, 6 pages.

English Translation of Korean Notice of Preliminary Rejection issued on Jun. 5, 2012 in connection with Korean Patent Appln. No. 10-2011-7011167, 1 page.

Australian Patent Office Examination Report issued on Nov. 25, 2011 in connection with Australian Application No. 2009305521, 2 pages.

* cited by examiner

ULTRA-HIGH EFFICIENCY MULTI-JUNCTION SOLAR CELLS USING POLYCHROMATIC DIFFRACTIVE CONCENTRATORS

BACKGROUND OF THE INVENTION

The invention relates to the field of photovoltaic cells, and in particular to a photovoltaic cell having polychromatic diffractive lenses that split and concentrate or focus the solar spectrum, directing the different spectral bands to appropriate cells.

In conventional single-junction solar cells, when a photon of energy higher than the semiconductor bandgap is absorbed, charge carriers are generated. These charge carriers are attracted to different electrodes, generating an open-circuit voltage. When a load is connected to the cell, a current flows, thus generating electrical power. When the photon has energy larger than the band-gap, the extra energy is mostly transferred into the generated free carriers themselves. These so-called "hot-carriers" lose most of this extra energy as heat by collisions with the crystal structure of the semiconductor. Therefore, the energy within a significant portion of the solar spectrum is wasted.

To overcome this limitation, multi junction (or tandem) solar cells where used. In these tandem cells, multiple layers of semiconductor solar cells are grown on a single substrate. The bandgaps of these multiple solar cells are adjusted such that the bandgap energy decreases from top to bottom. Therefore, higher energy photons are absorbed in the top-most layer, while the rest of the spectrum passes unabsorbed. The subsequent layers (or cells) with lower bandgaps absorb the lower energy photons. These multiple cells are connected in series and a cumulative open-circuit voltage is generated across the entire structure.

However, these tandem multi junction cells have several disadvantages. There is some absorption as the light transmits through each multi junction cell, lowering the overall conversion efficiency. In the tandem cell, the sub-cells are connected in series. The lowest current in the series connection limits the current. This significantly reduces the achievable efficiency since the current generated by each cell is not the same. Tandem multi-junction cells require special care in designing the tunnel junction that connect the cells in series. Optical transparency (wide band-gap) and low electrical resistance are incompatible. Furthermore lattice mismatch is a problem for semiconductor tandem cells.

In the tandem cell, it is very difficult to use more than 3 sub-cells. Since a tightly focusing concentrator is used, the active area of the solar sub-cells is greatly reduced. This will decrease the material costs especially of the sub-cell junction materials.

SUMMARY OF THE INVENTION

According to one aspect of the invention, there is provided a photovoltaic cell. The photovoltaic cell includes a concentrator optic structure that separates the solar spectrum of light into a plurality of spectral bands. The concentrator optic structure focuses these spectral bands into a plurality of concentric regions. A multitude of sub-cells are each approximately positioned at a concentric region associated with a respective spectral band produced by the concentrator optic structure. Each of the sub-cells stores or generates energy from the respective spectral band.

According to another aspect of the invention, there is provided a method of forming a photovoltaic cell. The method includes forming a concentrator optic structure that separates the solar spectrum of light into a plurality of spectral bands. The concentrator optic structure focuses these spectral bands into a plurality of concentric tightly focused ring-shaped spots and a central round spot. Also, the method includes forming a multitude of sub-cells that are each approximately positioned at a concentric region associated with a respective spectral band produced by the concentrator optic structure. Each of the sub-cells stores or generates energy from the respective spectral band.

According to another aspect of the invention, there is provided a method of storing light energy in a photovoltaic cell. The method includes providing a concentrator optic structure that separates the solar spectrum of light into a plurality of spectral bands. The concentrator optic focuses these spectral bands into a plurality of concentric regions. Also, the method includes approximately positioning each of a plurality of circular sub-cells at a ring-shaped spot associated with a respective spectral band produced by the concentrator optic structure. Each of the sub-cells stores or generates energy from said respective spectral band.

According to another aspect of the invention, there is provided a photovoltaic storage structure. The photovoltaic storage structure includes a multitude of photovoltaic cells such that each of the photovoltaic cells includes: a concentrator optic structure separates the solar spectrum of light into a plurality of spectral bands; the concentrator optic structure focuses these spectral bands into a plurality of concentric regions; and multitude of sub-cells are each approximately positioned at a concentric region associated with a respective spectral band produced by the concentrator optic structure; each of the sub-cells stores or generates energy from the respective spectral band. Also, the photovoltaic storage structure includes a multitude of electrodes coupled to the circular sub-cells for retrieving the energy stored in the circular sub-cells.

According to one aspect of the invention, there is provided a photovoltaic cell. The photovoltaic cell includes a concentrator optic structure that separates the solar spectrum of light into a plurality of spectral bands. The concentrator optic structure focuses these spectral bands into a plurality of one dimensional regions. A multitude of sub-cells are each approximately positioned at an one dimensional region associated with a respective spectral band produced by the concentrator optic structure. Each of the sub-cells stores or generates energy from the respective spectral band.

DETAILED DESCRIPTION OF THE INVENTION

The invention is a novel solar or photovoltaic cell comprising polychromatic diffractive lenses that split and concentrate (or focus) the solar spectrum, directing the different spectral bands to appropriate cells. This new design will be able to convert significantly higher portions of the solar spectrum to useful electrical power. Furthermore, the design simplifies the multi junction cell and enables planar fabrication processes to reduce manufacturing costs.

Figure 1:
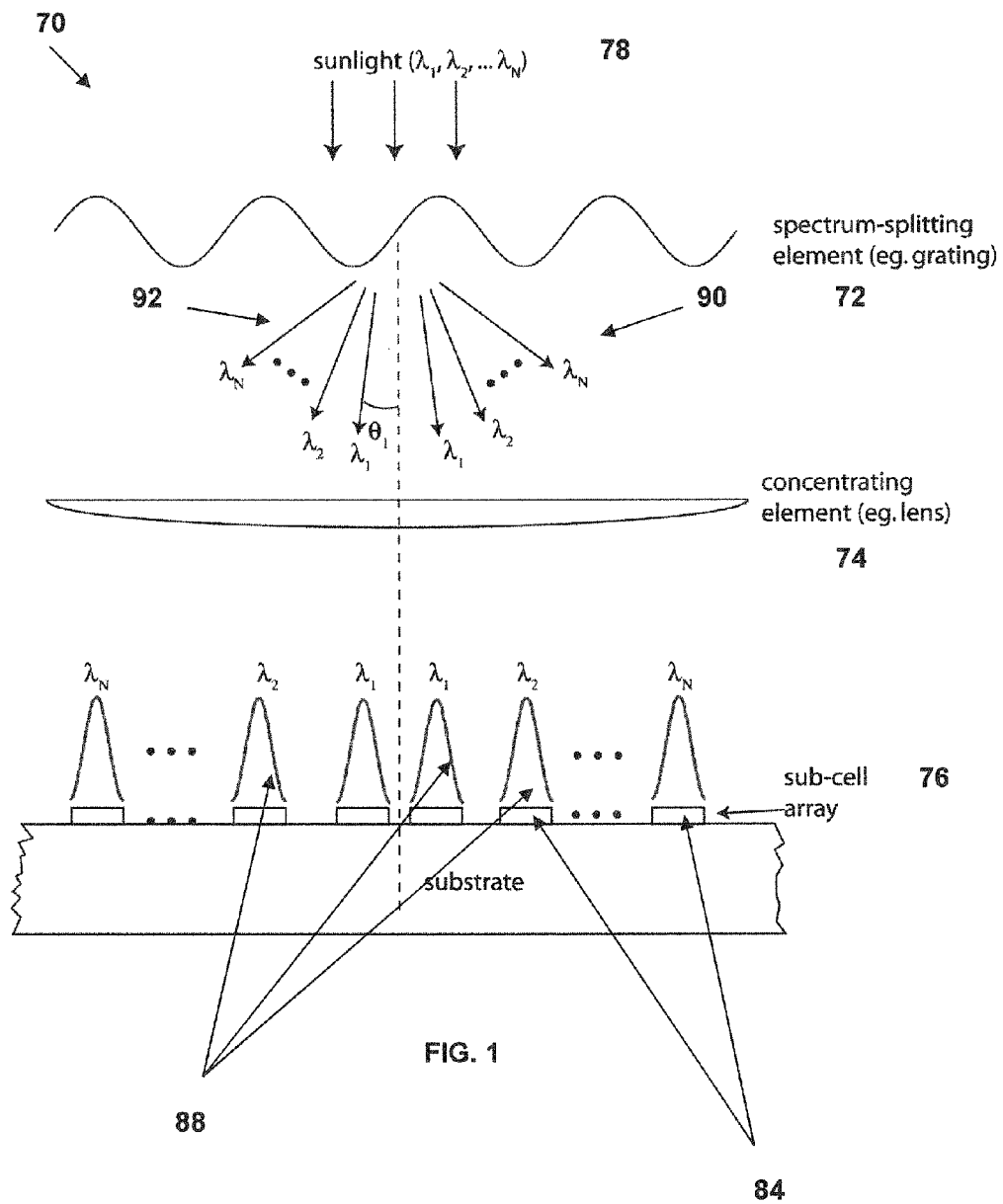
FIG. 1 is a schematic diagram illustrating a general overview of the inventive solar cell.

FIG. 1 is a schematic diagram illustrating a general overview of the inventive solar cell 70. The cell 70 includes a spectrum-splitting element 72, a concentrating element 74, and a sub-cell array 76. The spectrum grating element 74 splits an incoming sunlight 78 into its two respective spectrums 90, 92, each spectrum is associated with one spectral band having one of the following central wavelengths ($\lambda_1$ ... $\lambda_n$). Note the spectrum-splitting element 72 is not necessary in other embodiments of the present invention. The spectrum-splitting element 72 can be a sinusoidal grating or a binary grating or a blazed grating or a holographic element.

The concentrating element 74 focuses these spectral bands into a plurality of concentric regions 88. The concentrating element 74 can be a polychromatic lens, a plano-convex lens or any positive lens or a zone plate or a blazed zone plate or a photon sieve. It can also be an array of smaller elements, each concentrating a different part of the spectrum onto a corresponding cell underneath. An array 76 of sub-cells 84 laterally placed on a substrate 82 such that each sub-cell 84 is illuminated by concentrated light associated with the concentric regions 88 of the spectral band corresponding to its bandgap. Each sub-cells 84 generates energy from the respective spectral band. The appropriate portion of the spectral band is chosen according to the highest energy-conversion efficiency of each sub-cell 84.

Figure 2A:
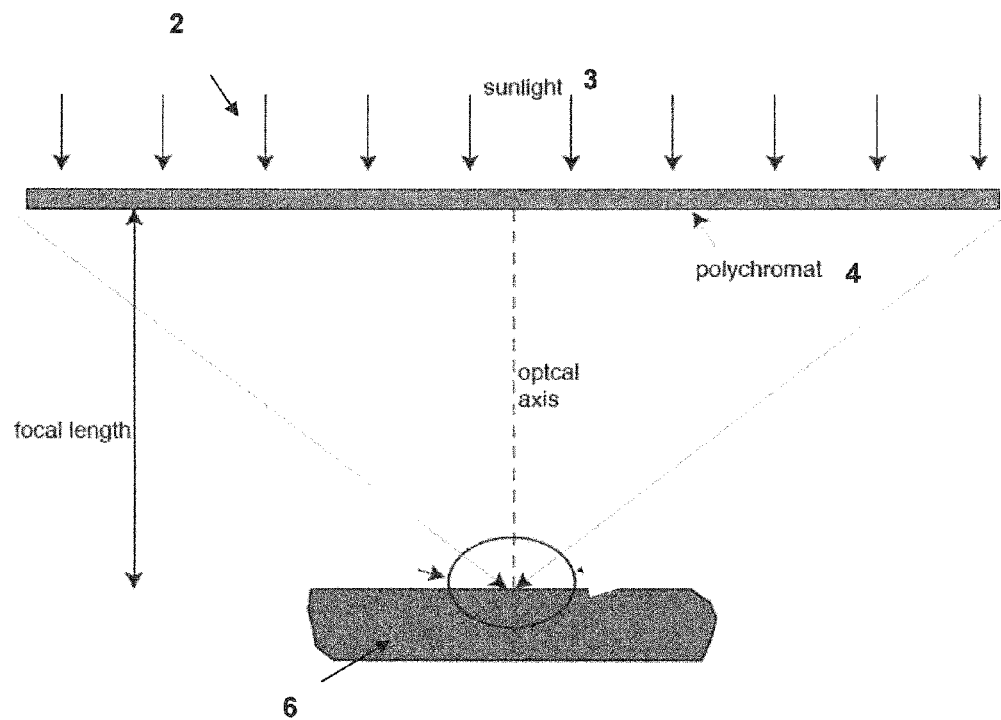
FIGS. 2A-2B are schematic diagrams illustrating the novel photovoltaic cell structure.

Another embodiment of the inventive solar cell 2 is shown in FIG. 2A. The cell 2 is composed of a concentrator optic 4, or polychromatic lens, and an array of single-junction circular solar sub-cells 6 that are arranged laterally may not necessarily be connected in series. The polychromat lens is a specially designed diffractive lens that separates the solar spectrum 3 into previously specified spectral bands. The polychromat lens 4, having a focal length, also focuses these spectral bands into concentric tightly focused ring-shaped spots and a central round spot on the array 6. The polychromat lens 4 can also be designed to focus off-axis illumination efficiently. This will eliminate the need for expensive sun-tracking mechanism. The sub-cells 6 are each approximately positioned at a ring-shaped spot associated with a respective spectral band produced by the polychromat lens 4. Each of the sub-cells 6 generates energy from their respective spectral band. The array 6 includes conventional cells, which can be semiconductor, organic-based, or any other form of photovoltaic cell, whose bandgap can be controlled.

Figure 2B:
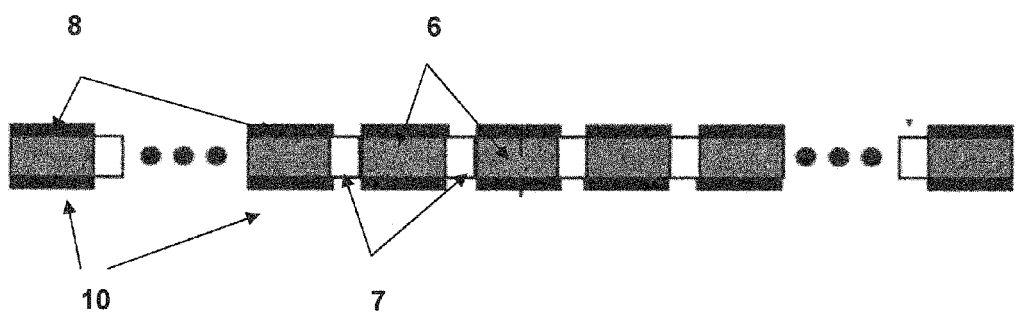

FIG. 2B shows the cross sectional-view of cell 6 where, each ring-shaped sub-cell 6 can have its own pair of contacts, top electrode 8 and bottom electrode 10, if required. The substrate supporting each of the rings 6 can serve as a common bottom electrode 10 for its respective sub-cell 6. Each subcell 6 is connected to the other by an insulator 7.

Figure 3A:
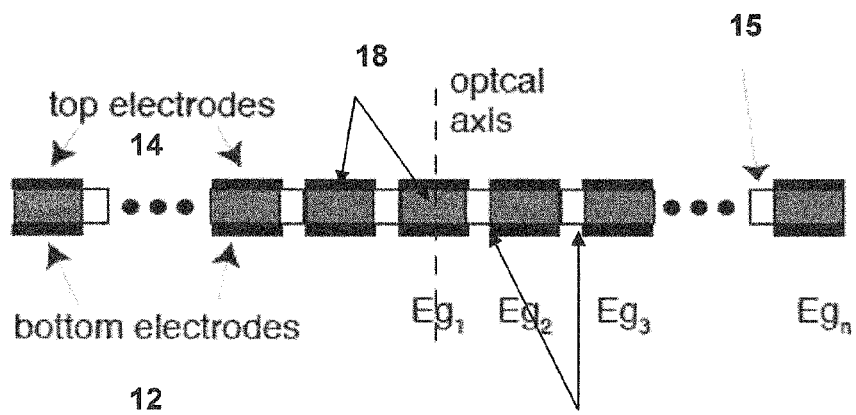
FIGS. 3A-3B are schematic diagrams illustrating electrodes used by the inventive photovoltaic cell structure.
Figure 3B:
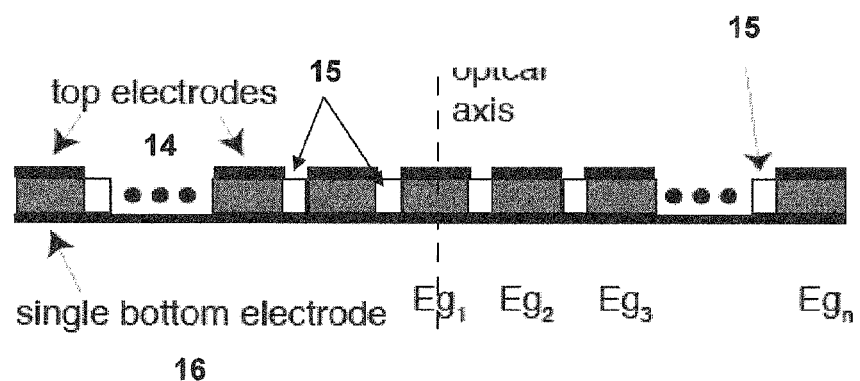

The bottom electrodes 12 can be separate for each sub-cell 18 as shown in FIG. 3A or a common bottom electrode 16 may be used, as shown in FIG. 3B. The top electrodes are always separate 14 and each subcell 18 is connected using an insulator 15. The substrate of each sub-cell 18 can be used as the bottom electrode or form the bottom electrodes 12, 16 as well. Separate electrodes are useful if the sub-cells 18 are connected independently via the bottom electrodes 12 and buried conducting lines. Buried lines can be preferable as they will not interfere with the light.

Figure 4:
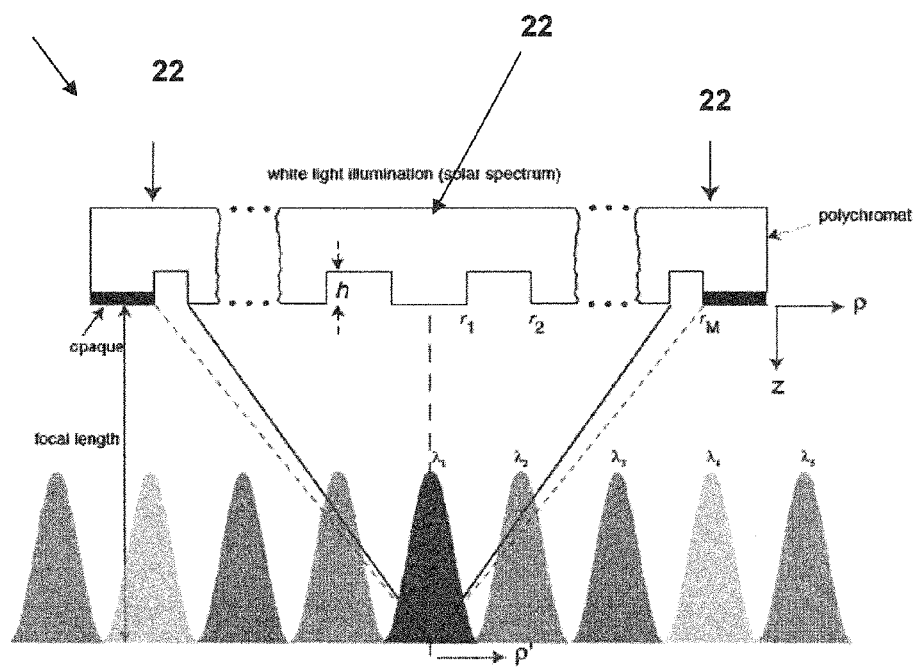
FIG. 4 is a schematic diagram illustrating a polychromat lens used in accordance with the invention.

The design of a polychromat lens is based on U.S. patent application Ser. No. 12/253,512, which is incorporated in its entirety. The polychromat lens is a phase element, comprised of concentric rings, where alternating rings are phase-shifted with respect to one another. A schematic of this lens is shown in FIG. 4.

The polychromat lens structure 20 includes a multitude of zones 22 having radii $r_1, r_2, \ldots, r_M$ and the height of the zones, h. Stylized intensity distributions in the focal plane illustrate the design requirement for a polychromat lens 20 that focuses a bright spot at $\lambda_1$ and a ring-shaped spot at $\lambda_2$ as well as the other wavelengths $\lambda_3$-$\lambda_5$. Outside the polychromat lens 20 is opaque. As shown in FIG. 2, the phase shift is achieved via a varying height difference between alternate zones. The optic can be described by a circular-symmetric transmission function.

$$T(\rho) = \begin{cases} e^{i\psi} & r_{2m} < \rho \le r_{2m+1} \cdot m \in I^+ \\ 0 & \rho > r_M \\ 1 & \text{elsewhere} \end{cases} \quad \text{EQ. 1}$$

where $\rho$ is the radial coordinate, $r_m$, is the radius of the $m^{th}$ zone, and M is the total number of zones. The relative phase-shift between neighboring zones, $\psi$, can be related to the zone height, h, via $$\psi = 2\pi \frac{h}{\lambda}[\text{Re}(n(\lambda)) - 1], \quad \text{EQ. 2}$$

where $\text{Re}(n(\lambda))$ is the real part of the refractive index of the lens material.

The design variables available to us are the radii of the rings as well as the binary phase shift of the rings. Since the operation of this lens is based upon diffraction, different wavelengths of light will diffract at different angles from the lens. By appropriately selecting the radii of the rings as well as the phase shift, it is possible to design a lens (polychromat) to focus different wavelengths into spatially separate concentric rings, as shown in FIG. 5.

Figure 5:
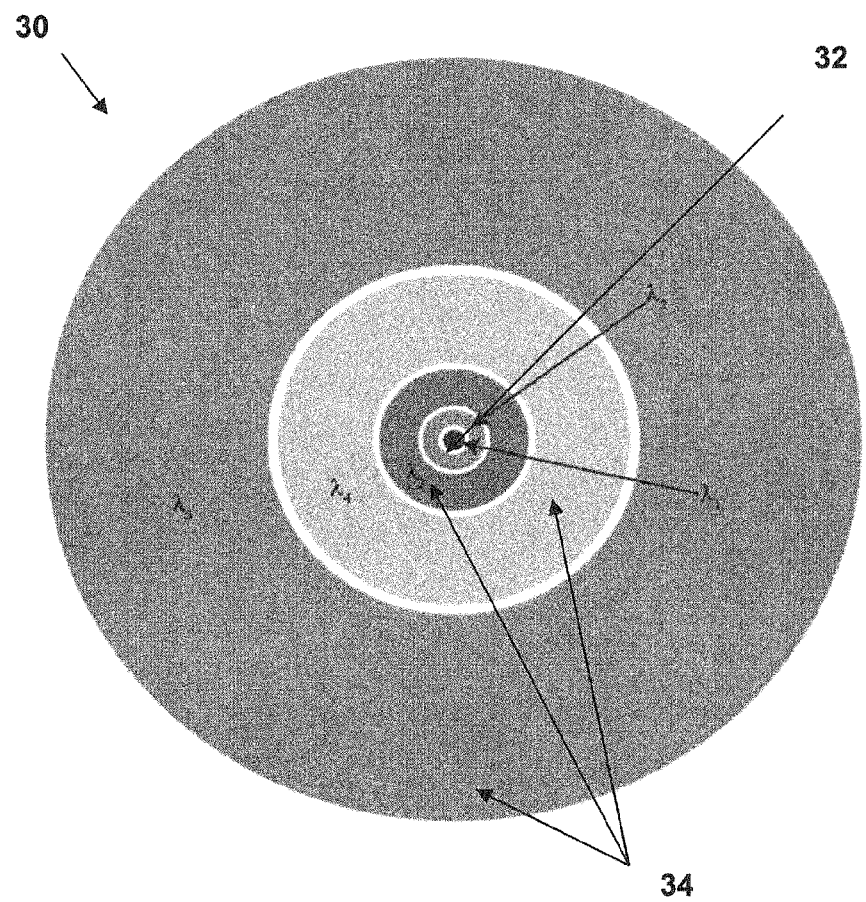
FIG. 5 is schematic diagram illustrating the focal plane of the polychromat lens structure used in accordance with the invention.

FIG. 5 illustrates the top-view of the focal plane 30 of a polychromat lens 32. Different wavelengths ($\lambda 1, \lambda 2, \lambda 3$) are focused to different concentric rings 34 in the same focal plane 30. Each ring 34 illuminates a photovoltaic sub-cell that is optimized to absorb that spectral band efficiently.

In addition, it is possible to accommodate a wide cone of incident angles and still generate tightly focused rings using this technique. This is achieved by simply changing the optimization condition by incorporating a wider input angle. This is important to avoid expensive sun-tracking.

Figure 6:
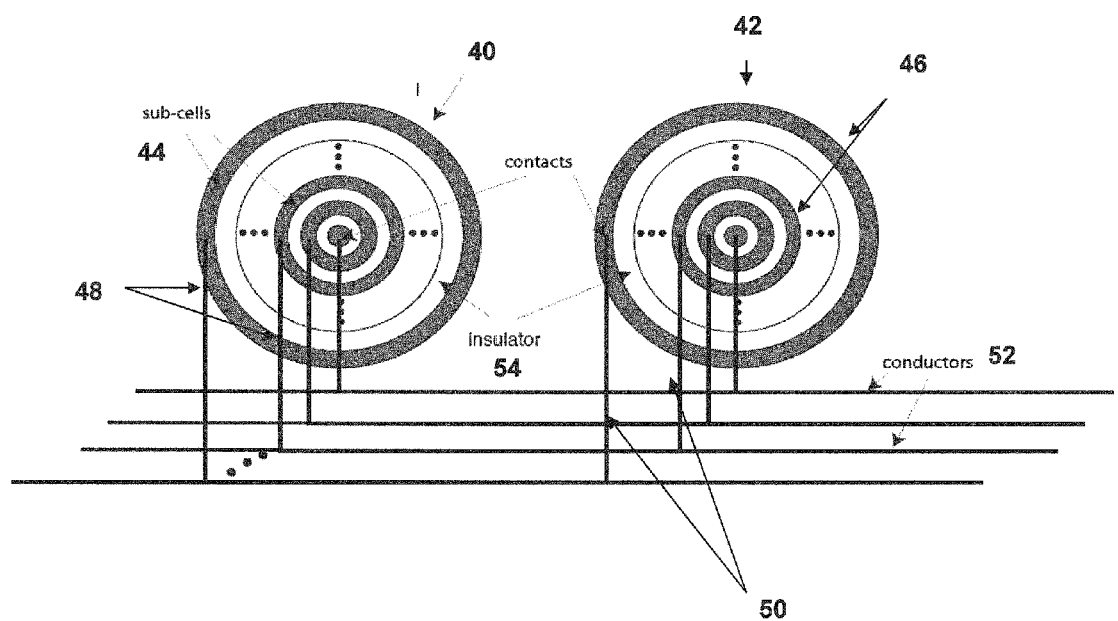
FIG. 6 is a schematic diagram illustrating an array of solar cells formed in accordance with the invention.

In the configuration shown in FIG. 6, a multitude of photovoltaic cells 40, 42 having sub-cells 44, 46 of the same bandgap are all connected in parallel using a multiple output electrodes 48, 50; one for each sub-cell 44, 46 of a given bandgap. The output electrodes 48, 50 are connected to conductors 50. The sub-cells 44, 46 as well as the cells 40, 42 in the array can be connected in any configuration to maximize the output power. Between each of the sub-cells are 44, 46 an insulator 54 is added. The connections might be through the bottom electrode and buried conductors to avoid any shadowing or other deleterious effects on the incident light. In a different scenario, the conductors can include transparent conductors.

Figure 7:
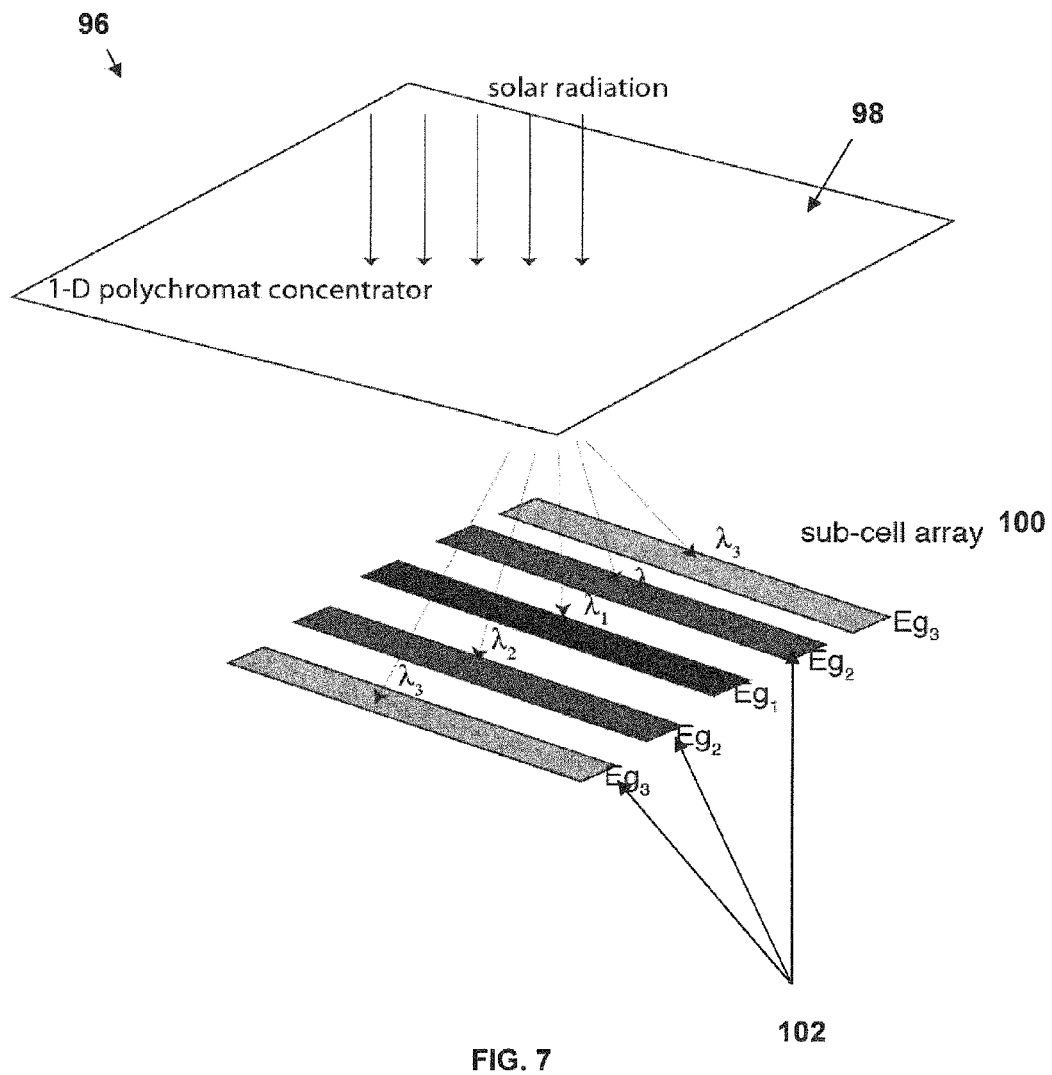
FIG. 7 is a schematic diagram is illustrating a solar cell structure having a 1-D polychromatic structure and 1-D array of solar cells 100

FIG. 7 is a schematic diagram is illustrating a solar cell structure 96 having a 1-D polychromatic structure 98 and 1-D array of solar cells 100. The 1-D polychromatic structure 98 receives sunlight or solar radiation and separates the solar spectrum of light into a plurality of spectral bands ($\lambda_1 \ldots \lambda_n$). The 1-D polychromatic structure 98 focuses these spectral bands into a plurality of concentric regions. The 1-D array 100 includes a multitude of 1-D sub-cells 102 that are each approximately positioned at a concentric region associated with a respective spectral band ($\lambda_1 \ldots \lambda_n$) produced by the 1-D polychromatic structure 98. Each of the sub-cells 102 generates energy ($E_{g1}$-$E_{gn}$) from the respective spectral band ($\lambda_1 \ldots \lambda_n$).

Although the present invention has been shown and described with respect to several preferred embodiments thereof, various changes, omissions and additions to the form and detail thereof, may be made therein, without departing from the spirit and scope of the invention.

What is claimed is:

1. A photovoltaic cell comprising:
    a dichromatic lens; and
    a plurality of sub-cells;
    wherein the dichromatic lens comprises: a plurality of zones arranged on a lens structure, each of said zones having a specified radius and varying height, said lens structure focusing propagating light applicable to any intensity distribution for a plurality of wavelengths, said lens structure focusing propagating light of a specified first wavelength to a first region and a specified second wavelength to a second region when a phase shift occurs because of varying heights of said zones; and
    wherein the plurality of sub-cells comprises: at least a first sub-cell positioned at the first region to absorb light from the plurality of zones comprising the first specified wavelength and at least a second sub-cell positioned at the second region to absorb light from the plurality of zones comprising the second wavelength, wherein the absorber layer of the first sub-cell is photosensitive to the first wavelength and the absorber layer of the second sub-cell is photosensitive to the second wavelength.

2. The photovoltaic cell of claim 1, wherein said sub-cells each comprise a top and bottom electrode.

3. The photovoltaic cell of claim 2, wherein said sub-cells each share a common bottom electrode.

4. The photovoltaic cell of claim 2, wherein said sub-cells each have separate bottom electrodes.

5. The photovoltaic cell of claim 1, wherein said dicromatic diffractive lens focuses off-axis illumination.

6. The photovoltaic cell of claim 1, wherein said sub-cells comprise semiconductor-based materials.

7. The photovoltaic cell of claim 1, wherein said sub-cells comprise organic-based materials.

8. A method of forming a photovoltaic cell comprising:
    forming a dichromatic lens; and
    forming a plurality of sub-cells;
    wherein forming the dichromatic lens comprises: forming a plurality of zones arranged on a lens structure, each of said zones having a specified radius and varying height, said lens structure focusing propagating light applicable to any intensity distribution for a plurality of wavelengths, said lens structure focusing propagating light of a specified first wavelength to a first region and a specified second wavelength to a second region when a phase shift occurs because of varying heights of said zones; and
    wherein forming the plurality of sub-cells comprises: forming at least a first sub-cell positioned at the first region to absorb light from the plurality of zones comprising the first specified wavelength and at least forming a second sub-cell positioned at the second region to absorb light from the plurality of zones comprising the second wavelength, wherein the absorber layer of the first sub-cell is photosensitive to the first wavelength and the absorber layer of the second sub-cell is photosensitive to the second wavelength.

9. The method of claim 8, wherein said sub-cells each comprise a top and bottom electrode.

10. The method of claim 9, wherein said sub-cells each share a common bottom electrode.

11. The method of claim 9, wherein said sub-cells each have separate bottom electrodes.

12. The method of claim 8, wherein said dichromatic lens focuses off-axis illumination.

13. The method of claim 8, wherein said sub-cells comprise semiconductor-based materials.

14. The method of claim 8, wherein said sub-cells comprise organic-based materials.

15. A photovoltaic storage structure comprising:
    a plurality of photovoltaic cells, each of said photovoltaic cells comprising:
        a dichromatic lens; and
        a plurality of sub-cells;
        wherein the dichromatic lens comprises: a plurality of zones arranged on a lens structure, each of said zones having a specified radius and varying height, said lens structure focusing propagating light applicable to any intensity distribution for a plurality of wavelengths, said lens structure focusing propagating light of a specified first wavelength to a first region and a specified second wavelength to a second region when a phase shift occurs because of varying heights of said zones; and
        wherein the plurality of sub-cells comprises: at least a first sub-cell positioned at the first region to absorb light from the plurality of zones comprising the first specified wavelength and at least a second sub-cell positioned at the second region to absorb light from the plurality of zones comprising the second wavelength, wherein the absorber layer of the first sub-cell is photosensitive to the first wavelength and the absorber layer of the second sub-cell is photosensitive to the second wavelength; and
    a plurality of electrodes coupled to said sub-cells for retrieving the energy stored in said sub-cells.

* * * * *